US012582008B2

(12) United States Patent
Lim et al.

(10) Patent No.: US 12,582,008 B2
(45) Date of Patent: Mar. 17, 2026

(54) POWER MODULE

(71) Applicants: Hyundai Motor Company, Seoul (KR); Kia Corporation, Seoul (KR)

(72) Inventors: Suk Hyun Lim, Hwaseong-Si (KR); Jun Hee Park, Hwaseong-Si (KR)

(73) Assignees: Hyundai Motor Company;, Seoul (KR); Kia Corporation, Seoul (KR)

( * ) Notice: Subject to any disclaimer, the term of this patent is extended or adjusted under 35 U.S.C. 154(b) by 400 days.

(21) Appl. No.: 18/144,691

(22) Filed: May 8, 2023

(65) Prior Publication Data

US 2024/0186217 A1 Jun. 6, 2024

(30) Foreign Application Priority Data

Dec. 5, 2022 (KR) ........................ 10-2022-0167904

(51) Int. Cl.
| | |
|---|---|
| *H01L 25/07* | (2006.01) |
| *H01L 23/46* | (2006.01) |
| *H01L 23/473* | (2006.01) |
| *H01L 23/498* | (2006.01) |

(52) U.S. Cl.
CPC ............ *H01L 25/072* (2013.01); *H01L 23/46* (2013.01); *H01L 23/473* (2013.01); *H01L 23/49844* (2013.01)

(58) Field of Classification Search
CPC .... H01L 23/467; H01L 23/473; H01L 23/427
See application file for complete search history.

(56) References Cited

U.S. PATENT DOCUMENTS

| | | | | |
|---|---|---|---|---|
| 11,067,343 B2 * | 7/2021 | Joshi | ..................... | F28D 20/023 |
| 2025/0336767 A1 * | 10/2025 | Inamdar | ............... | H01L 23/473 |

FOREIGN PATENT DOCUMENTS

| | | | | |
|---|---|---|---|---|
| KR | 10-2024-0062178 | 5/2024 | | |
| WO | WO-2024009613 A1 * | 1/2024 | .............. | H02M 7/48 |
| WO | WO-2024009617 A1 * | 1/2024 | .............. | H01L 23/42 |

* cited by examiner

*Primary Examiner* — David A Zarneke
(74) *Attorney, Agent, or Firm* — MORGAN, LEWIS & BOCKIUS LLP

(57) ABSTRACT

A power module include at least one substrate including an insulating layer and a metal circuit disposed on a first side of the insulating layer, a semiconductor chip, and at least one vapor chamber including a fluid flowing therein and disposed between the semiconductor chip and one of the at least one substrate, wherein each of the at least one vapor chamber includes a first side thereof including a plane area greater than or equal to a plane area of the semiconductor chip and connected to the metal circuit of the one of the at least one substrate, and a second side thereof facing the first side along a first direction and connected to the semiconductor chip.

17 Claims, 2 Drawing Sheets

POWER MODULE

CROSS REFERENCE TO RELATED APPLICATION

The present application claims priority to Korean Patent Application No. 10-2022-0167904, filed Dec. 5, 2022, the entire contents of which is incorporated herein for all purposes by this reference.

BACKGROUND OF THE PRESENT DISCLOSURE

Field of the Present Disclosure

The present disclosure relates to a power module, and more particularly, to a power module capable of efficiently eliminating heat generated from semiconductor chips through vapor chambers, each having a fluid flowing therein and a specific shape.

Description of Related Art

With the recent increase in interest in the environment, eco-friendly vehicles provided with an electric motor as a power source are increasing. The eco-friendly vehicles are also referred to as electrified vehicles, and representative examples include electric vehicles (EVs) and hybrid electric vehicles (HEVs).

Generally, such an electrified vehicle is provided with an inverter for converting DC power into AC power when a motor is driven, and the inverter is configured with at least one power module for receiving the DC power from a battery and supplies the power for driving the motor.

Meanwhile, a power module is provided with semiconductor chips for performing a switch function, and as high voltage and large current flow during operation of the power module, heat generation of the semiconductor chips is accompanied. To stably operate the power module, it is required to eliminate the heat, and various methods are applied to this end.

As one of the methods, there is a method of cooling the power module by transferring heat generated from the semiconductor chips to a substrate and dissipating the heat through cooling channels connected to the power module.

However, in a case of the conventional heat dissipation method, a transfer range of heat generated from semiconductor chips is limited, so it is required to propose a method in which the generated heat of a power module is more efficiently eliminated.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module configured for effectively eliminating heat generated from a power module.

The technical problems to be solved in an exemplary embodiment of the present disclosure are not limited to the technical problems mentioned above, and other technical problems that are not mentioned will be clearly understood by those skilled in the art to which the present disclosure belongs from the following description.

According to an exemplary embodiment of the present disclosure for realizing the above objective, there is provided a power module including: at least one substrate including an insulating layer and a metal circuit disposed on a first side of the insulating layer: a semiconductor chip: and at least one vapor chamber having a fluid flowing therein and disposed between the semiconductor chip and one of the at least one substrate, wherein each of the at least one vapor chamber includes: a first side thereof including a plane area greater than or equal to a plane area of the semiconductor chip and connected to the metal circuit of the one of the at least one substrate: and a second side thereof facing the first side along a first direction and connected to the semiconductor chip.

In an expect of the present disclosure, the at least one substrate may include a first substrate and a second substrate spaced along the first direction so that the respective metal circuits thereof face each other with the semiconductor chip interposed therebetween.

In an expect of the present disclosure, the at least one vapor chamber may be electrically connected to any one metal circuit of the at least one substrate.

In an expect of the present disclosure, the first side of the at least one vapor chamber may be bonded to a metal circuit of the at least one substrate through soldering.

In an expect of the present disclosure, the first side of the at least one vapor chamber may not overlap an insulation line forming a metal circuit pattern.

In an expect of the present disclosure, the at least one vapor chamber may include a first vapor chamber including a second side connected to an active area of the semiconductor chip.

In an expect of the present disclosure, a plane area of the second side of the first vapor chamber may be less than or equal to a plane area of the active area.

In an expect of the present disclosure, a plane area of a portion extending by a first distance along the first direction on a first side of the first vapor chamber may be greater than or equal to a plane area of a portion extending by a second distance greater than the first distance.

In an expect of the present disclosure, the at least one vapor chamber may further include a second vapor chamber including a second side thereof connected to a side of the semiconductor chip opposite to the active area of the semiconductor chip.

In an expect of the present disclosure, a plane area of the second side of the second vapor chamber may be greater than or equal to the plane area of the semiconductor chip.

In an expect of the present disclosure, in the second vapor chamber, a plane area of a first side thereof and the plane area of the second side thereof may correspond to each other.

In an expect of the present disclosure, a plurality of semiconductor chips may be configured, each semiconductor chip may be spaced from each other along a second direction crossing the first direction on the at least one substrate, and the at least one vapor chamber may be spaced from each other along the second direction so that each vapor chamber may be disposed between any one of the at least one substrate and any one of the plurality of semiconductor chips.

In an expect of the present disclosure, each semiconductor chip may be disposed so that directions in which active areas of a predetermined number of the plurality of semiconductor chips are directed and directions in which active areas of remaining number of the plurality of semiconductor chips are directed are opposite to each other along the first direction, and in the at least one vapor chamber, a plane area of a portion in which an active area of each semiconductor chip is disposed may be less than or equal to the plane area of the active area, and a plane area of a portion in which a side opposite to the active area of each semiconductor chip is disposed may be greater than or equal to the plane area of each semiconductor chip.

In an expect of the present disclosure, each of the at least one substrate may further include a heat dissipation layer disposed on a first side of the insulating layer opposite to a second side of the insulating layer along the first direction, the second side facing each semiconductor chip.

In an expect of the present disclosure, the heat dissipation layer may be connected to a cooling channel.

According to various exemplary embodiments of the present disclosure as described above, the vapor chambers, each having the fluid flowing therein and the predetermined shape, further expand a range in which heat generated through the structure for connecting the substrates and semiconductor chips is transferred to the substrates, whereby thermal conductivity of the power module may be improved.

Accordingly, the cooling efficiency of the power module is improved so that the power module may stably operate at a lower temperature.

The effects of the present disclosure are not limited to the above-mentioned effects, and other effects that are not mentioned herein will be clearly understood by those skilled in the art from the following description.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
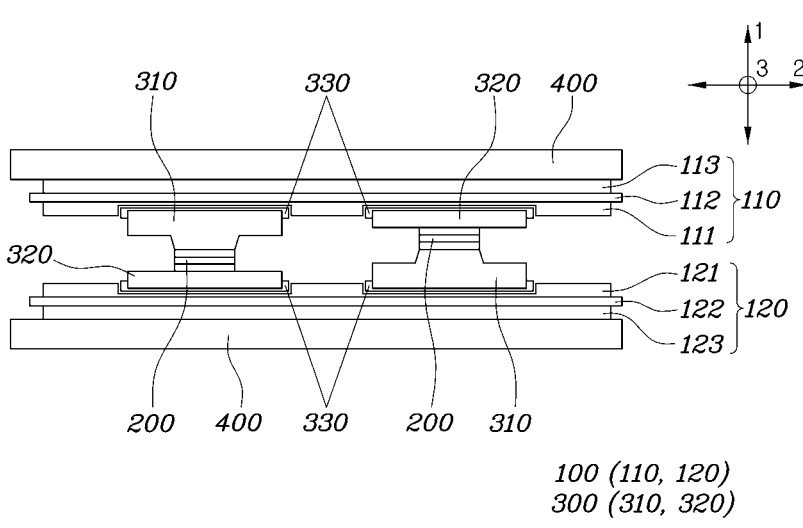
FIG. 1 is a cross-sectional view exemplarily illustrating a power module according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, an exemplary embodiment included in the present specification will be described in detail with reference to the accompanying drawings, but regardless of the reference numerals, the same or similar components are provided identical reference numbers, and the overlapping description thereof will be omitted. The terms "module" and "part or unit" for the components used in the following descriptions are provided or mixed in consideration of only the ease of writing the specification, and the suffixes do not have distinct meanings or roles by themselves. In describing the exemplary embodiment included in the present specification, when it is determined that a detailed description of a related known technology may obscure the subject matter of the exemplary embodiment included in the present specification, the detailed description thereof will be omitted. Furthermore, the accompanying drawings are only for easy understanding of the exemplary embodiment included in the present specification, the technical idea included in the present specification is not limited by the accompanying drawings, and it should be understood that the accompanying drawings include all changes, equivalents, or substitutes, which are included in the spirit and technical scope of the present disclosure.

It will be understood that, although the terms including ordinal numbers, such as first, second, etc. may be used herein to describe various elements, these elements should not be limited by these terms. These terms are only used for distinguishing one component from another component.

When a component is referred to as being "connected", "coupled", or "linked" to another component, that component may be directly connected, coupled, or linked to that other component. However, it should be understood that yet another component between each of the components may be present. In contrast, it should be understood that when a component is referred to as being "directly coupled" or "directly connected" to another component, there are no intervening components present.

As used herein, the singular forms are intended to include the plural forms as well, unless the context clearly indicates otherwise.

It will be further understood that the terms "comprise", "include", "have", etc. When used in the present specification, specify the presence of stated features, integers, steps, operations, elements, components, and/or combinations thereof but do not preclude the presence or addition of one or more other features, integers, steps, operations, elements, components, and/or combinations thereof.

The exemplary embodiment of the present disclosure proposes that vapor chambers 300, each having a fluid flowing therein, connect semiconductor chips 200 and a substrate 100 to each other, and a plane area of each chamber 300 connected to the substrate 100 is greater than or equal to a plane area of each semiconductor chip 200, so that heat generated from the semiconductor chips 200 may be efficiently eliminated.

Hereinafter, a configuration of the power module facilitating efficient elimination of generated heat according to the exemplary embodiment of the present disclosure will be described with reference to FIG. 1, FIG. 2, FIG. 3, and FIG. 4.

FIG. 1 is a cross-sectional view exemplarily illustrating the power module according to the exemplary embodiment of the present disclosure.

Referring to FIG. 1, the exemplary embodiment of the power module to which a double-sided cooling method is applied and in which substrates are respectively disposed above and below semiconductor chips is illustrated. The power module according to the exemplary embodiment of the present disclosure includes at least one substrate 100, a semiconductor chip 200, and a chamber 300, and may further include cooling channels 400 disposed on top portion and bottom portion of the power module. FIG. 1 mainly illustrates components related to the present disclosure, and naturally, the actual implementation of the power module may include more or fewer components than such components. Hereinafter, each component will be described.

First, the substrate 100 may include a first substrate 110 and a second substrate 120, and each of the substrates 110 and 120 respectively includes insulating layers 112 and 122.

When the double-sided cooling method is applied as in the exemplary embodiment shown in FIG. 1, the first substrate 110 and the second substrate 120 may be spaced in a first direction, to face each other with the semiconductor chip 200 therebetween. That is, in the exemplary embodiment of the present disclosure, the first substrate 110 refers to a substrate disposed on the upper side based on FIG. 1, and the second substrate 120 refers to a substrate disposed on the lower side based on FIG. 1.

Furthermore, the substrates 110 and 120 may respectively further include metal circuits 111 and 121, which are disposed on respective first sides facing the semiconductor chip 200, between the vapor chamber 300 and the corresponding insulating layers 112 and 122.

Here, the metal circuits 111 and 121 may be formed of, for example, a copper (Cu) material, and an electrical connection structure may be formed through patterns. When made of copper, the metal circuits 111 and 121 may also be implemented in a form of Direct Bonded Copper (DBC).

The insulating layers 112 and 122 may be formed of, for example, ceramic, and may respectively block electrical connections between the metal circuits 111 and 121 and heat dissipation layers 113 and 123.

Meanwhile, the semiconductor chip 200 may be disposed between the first substrate 110 and the second substrate 120, and may be a switching device, for example, an Insulated Gate Bipolar Transistor (IGBT), a Metal-Oxide-Semiconductor Field-Effect Transistor (MOSFET), and the like. Furthermore, a plurality of semiconductor chips 200 may be disposed in the power module according to the exemplary embodiments of the present disclosure.

Meanwhile, a vapor chamber 300 may have a structure in which a fluid flows therein, and to the present end, a cavity is formed therein and the fluid is filled in the cavity.

A first side of each of vapor chambers 300 may have a plane area greater than or equal to a plane area of a semiconductor chip 200, and may be connected to any one metal circuit 111 or 121 of at least one substrate 100, and a second side facing the first side along the first direction may be connected to the semiconductor chip 200.

For example, when the double-sided cooling method is applied as shown in FIG. 1, the vapor chambers 300 may be disposed between the semiconductor chips 200 and the metal circuit 111 of the first substrate 110, and between the semiconductor chips 200 and the metal circuit 121 of the second substrate 120.

Through the present way, heat generated in the semiconductor chips 200 may be effectively transferred to the substrate 100, and as a first side of a vapor chamber 300 is formed to have a plane area greater than or equal to a plane area of a semiconductor chip 200, a range in which the generated heat is transferred to the substrate 100 may be further expanded. Furthermore, as the heat transfer range is expanded, thermal conductivity of the entire power module may be improved and cooling efficiency may also be improved.

A vapor chamber 300 may include a first vapor chamber 310 in which an opposite side (i.e., a second side) of a first side thereof connected to the substrate 100 is connected to an active area of a semiconductor chip 200, and may further include a second vapor chamber 320 connected to an opposite side of the active area of the semiconductor chip 200.

The first vapor chamber 310 and the second vapor chamber 320 are the same in that the plane area of the first side connected to the substrate 100 is greater than or equal to the plane area of the semiconductor chip 200.

However, in the case of the first vapor chamber 310, an area of a second side of the first vapor chamber 310 connected to an active area of a semiconductor chip 200 may be formed to be less than or equal to that of the active area. Through the present way, heat generated in the active area of the semiconductor chip 200 may be induced to move in the first direction through a vapor chamber 300 and be transferred toward the substrate 100 first. The heat transferred in the first direction is then distributed over a wider area of the substrate 100 through the first side of the vapor chamber 300 including the plane area greater than or equal to the plane area of the semiconductor chip 200, facilitating efficient heat dissipation.

Furthermore, the first vapor chamber 310 may be formed so that a plane area of a portion extending by a first distance along the first direction on the first side connected to the substrate 100 is greater than or equal to a plane area of a portion extending by a second distance greater than the first distance. For example, the first vapor chamber 310 may be formed to have a shape in which the plane area thereof gradually increases from the vicinity of an active area of a semiconductor chip 200 to the vicinity of the substrate 100, and as shown in FIG. 1, may be formed to have the shape in which the plane area thereof greatly expands from a point spaced apart with a predetermined distance in the first direction in the semiconductor chip 200.

In contrast, unlike the first vapor chamber 310, the second vapor chamber 320 may be formed so that an area of a second side thereof connected to a semiconductor chip 200 is greater than or equal to a plane area of the semiconductor chip 200, and furthermore, may be formed so that a plane area of a portion thereof connected to the substrate 100 corresponds to a plane area of a portion connected to the semiconductor chip 200 (i.e., the areas of the first and second sides correspond to each other).

Meanwhile, the fluid inside the vapor chamber 300 may be, for example, a volatile fluid such as water vapor, methanol, or acetone, and additionally, may be appropriately selected according to a target temperature inside a power module or according to target thermal conductivity of the power module.

Furthermore, the vapor chamber 300 may be electrically connected to the metal circuit 111 or 112 of the substrate. To the present end, the vapor chamber 300 may be implemented with a metal material, and through the above configuration, the vapor chamber 300 may not only simply function as a medium to transfer heat generated in the semiconductor chip 200, but also function as a medium to transfer electric current.

Furthermore, as shown in FIG. 1, the substrate 100, the metal circuits 111 and 121, connected to the vapor chamber 300 may be formed to have a thinner thickness than those of peripheral portions not connected to the vapor chamber 300.

Connections between the substrate 100 and the vapor chamber 300 includes contact connection, and furthermore, the vapor chamber 300 may be bonded to either the metal circuit 111 of the first substrate or the metal circuit 121 of the second substrate. In the instant case, a bonding material 330 such as solder may be used for bonding the vapor chamber 300 and the metal circuit 111 or 121. Similarly, connections between the vapor chambers 300 and the respective semiconductor chips 200 may also be made through the bonding material 330 such as the solder. In the instant case, even though respective components are not directly connected, the respective components may be electrically connected.

Meanwhile, as shown in FIG. 1, when the first substrate 110 and the second substrate 120 are respectively disposed above and below a semiconductor chip 200, the vapor chambers 310 and 320 may be connected to both sides of the semiconductor chip 200, but unlike this, a single vapor chamber 300 may also be connected to the semiconductor chip 200. In the instant case, a first side of the semiconductor chip 200 may be connected to the vapor chamber 300 and a second side of the semiconductor chip 200 may be connected to the first substrate 110 or the second substrate 120. That is, at least one side of the upper and lower sides of the semiconductor chip 200 is connected to the vapor chamber 300, and a side not connected to the vapor chamber 300 is connected to the first substrate 110 or the second substrate 120, whereby the first substrate 110, the second substrate 120, and the semiconductor chip 200 may be connected to each other.

Meanwhile, a plurality of semiconductor chips 200 may be configured, and the semiconductor chip 200 may be spaced from each other along the second direction crossing the first direction on the at least one substrate.

In the instant case, the power module is characterized in that the vapor chambers 300 are spaced from each other along the second direction, and each of the vapor chambers 300 is disposed between any one of the plurality of semiconductor chips 200 and any one of at least one of the substrates 110 or 120.

Furthermore, the semiconductor chips 200 are disposed so that directions in which active areas of some of the plurality of semiconductor chips 200 are directed and directions in which active areas of the rest of the plurality of semiconductor chips 200 are directed are opposite to each other along the first direction (i.e., a flip chip structure).

In the instant case, shapes of the vapor chambers 300 to be connected may vary in accordance with the directions in which the active areas of the semiconductor chips 200 face. That is, a plurality of vapor chambers 300 may be disposed so that a plane area of a portion where an active area of each semiconductor chip 200 is disposed is less than or equal to the plane area of the active area, and a plane area of a portion where the opposite side of the active area of each semiconductor chip 200 is disposed is greater than or equal to the plane area of each semiconductor chip 200.

For example, the first vapor chambers 310 and the second vapor chambers 320 on the respective metal circuits 111 and 121 may be spaced from each other along the second direction, and the first vapor chambers 310 may be connected to the respective active areas of the semiconductor chips 200 and the second vapor chambers 320 may be connected to the opposite sides of the respective active areas of the semiconductor chips 200.

Through the present way, the structure according to the exemplary embodiment of the present disclosure may also be applied to a structure in which the plurality of semiconductor chips 200 is mounted in the power module, and furthermore, even when the plurality of semiconductor chips 200 is disposed in respective directions opposite to each other (i.e., a flip chip), electrical connection relationships are appropriately formed and heat dissipation performance may be improved.

Meanwhile, the substrate 100 may further include heat dissipation layers 113 and 123, which are disposed on respective sides opposite to first sides of the insulating layers 112 and 122, the first sides facing the semiconductor chips 200. The heat dissipation layers 113 and 123 may be implemented with a metal material such as copper (Cu). Heat generated from the semiconductor chips 200 may be transferred to the heat dissipation layers 113 and 123 through the respective vapor chambers 300, the metal circuits 111 and 121, and the insulating layers 112 and 122, and the heat dissipation layer 113 and 123 may lower the internal temperature of the power module by eliminating the heat transferred through heat exchange with the outside.

Furthermore, cooling channels 400 may be disposed outside the power module, for example, on an upper portion of the first substrate 110 and a lower portion of the second substrate 120. The heat dissipation layers 113 and 123 may be connected to the cooling channels 400. When the heat dissipation layers 113 and 123 are connected to the cooling channels 400, the temperature inside the power module may be lowered faster and more in degree than before.

In an exemplary embodiment of the present disclosure, a portion in the second side of the first vapor chamber 310 includes a lateral surface inclined in predetermined slope with respect to a portion in the first side of the first vapor chamber 310.

Meanwhile, unlike that shown in FIG. 1, the power module according to an exemplary embodiment of the present disclosure may also be applied in a case of a single-sided cooling method in which cooling is performed on one side of a single substrate 100.

Figure 2:
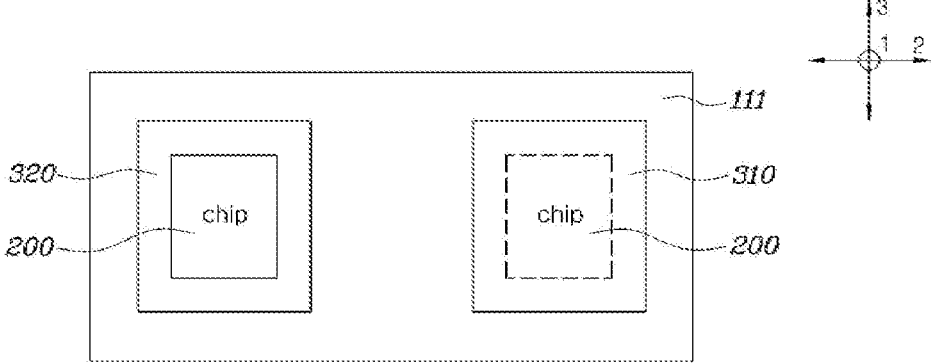
FIG. 2 is a view exemplarily illustrating a stacked structure of the power module according to the exemplary embodiment of the present disclosure.

FIG. 2 is a view exemplarily illustrating a stacked structure of the power module according to the exemplary embodiment of the present disclosure, and illustrates a view looking up at the first substrate 110 relative to a vertical position where the semiconductor chips 200 of the power module according to the exemplary embodiment to which the double-sided cooling method is applied are positioned.

Referring to FIG. 2, a cross section of a pair of semiconductor chips 200 is shown, and a first vapor chamber 310 and a second vapor chamber 320 may be stacked on respective upper portions of the semiconductor chips 200. Furthermore, a first substrate 110 may be stacked on upper portions of the first vapor chamber 310 and the second vapor chamber 320 again.

The metal circuit 111 may be disposed on a lower portion of the first substrate 110, and when looking up at the first substrate 110 relative to positions of the semiconductor chips 200, the vapor chambers 310 and 320, each including a larger plane area than the plane area of the semiconductor chip 200, and the metal circuit 111 including an even larger plane area than the plane areas of the vapor chambers 310 and 320 may be identified.

Meanwhile, a plane area of each portion to which the first substrate 110 and the vapor chambers 310 and 320 are connected is formed to be greater than or equal to the plane area of each semiconductor chip 200, and as the plane area of each connected portion increases, the heat transfer efficiency of the power module increases. However, a plane area of each portion to which the substrate 100 and the vapor chambers 310 and 320 are connected is limited to an extent that the plane area does not exceed an area of each of the insulating layers 112 and 122 and the electrical connection structure formed through the patterns of the metal circuits 111 and 121 is not affected.

To the present end, the first sides of the vapor chambers may be disposed so as not to overlap corresponding insulation lines forming the patterns of the metal circuits 111 and 121.

In contrast, a plane area of a portion to which the first vapor chamber 310 and an active area of a semiconductor chip 200 are connected may be formed to be less than or equal to a plane area of the active area, unlike the above case. In the instant case, as the plane area of the first vapor chamber 310 and the plane area of the semiconductor chip 200 coincide, the heat transfer efficiency of the power module increases.

However, in the case of the second vapor chamber 320 connected to an opposite side of the active area of the semiconductor chip 200, unlike the first vapor chambers 310, each of the plane areas of the upper and lower sides of the second vapor chamber 320 may be formed to be greater than or equal to the plane area of the semiconductor chip 200.

Meanwhile, because the first substrate 110 and the second substrate 120 are symmetrical, the above description may also be applied when looking down at the second substrate 120 relative to vertical positions of the semiconductor chips 200, and unlike those shown in FIG. 1 and FIG. 2, the above description may be applied even when the power module is configured with a single substrate.

Hereinafter, another exemplary embodiment applicable to the present disclosure will be described with reference to FIG. 3 and FIG. 4. In the following description, content already described with reference to FIG. 1 and FIG. 2 will be omitted, and the differences will be mainly described.

Figure 3:
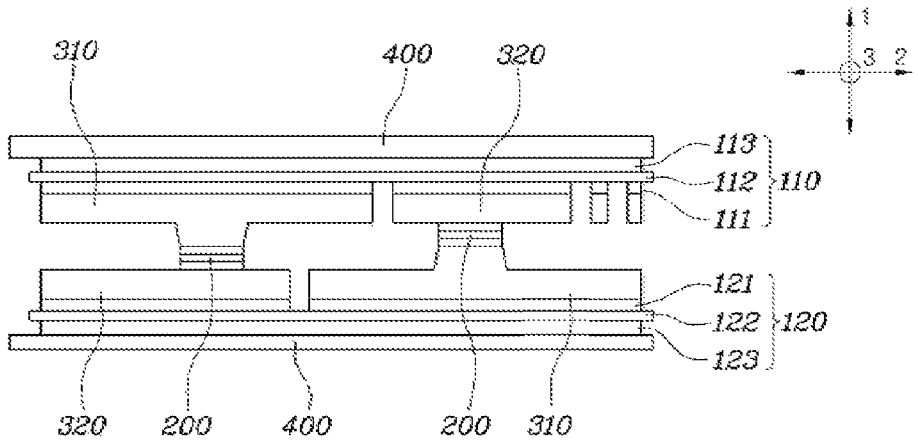
FIG. 3 is a cross-sectional view exemplarily illustrating a power module according to another exemplary embodiment of the present disclosure.

FIG. 3 is a cross-sectional view exemplarily illustrating a power module according to another exemplary embodiment of the present disclosure. FIG. 4 is a view exemplarily illustrating a stacked structure of the power module according to another exemplary embodiment of the present disclosure.

Figure 4:
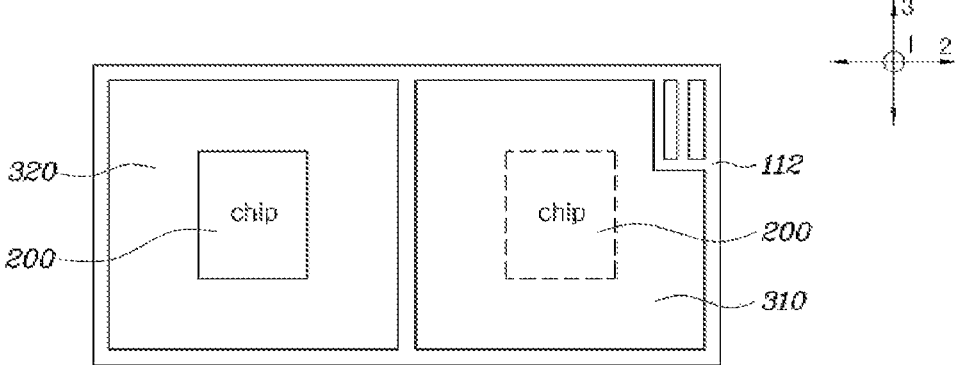
FIG. 4 is a view exemplarily illustrating a stacked structure of the power module according to another exemplary embodiment of the present disclosure.

Referring to FIG. 3 and FIG. 4, shapes of the power module are shown when the vapor chambers 300 have plane areas thereof corresponding to the plane areas of the metal circuits 111 and 121.

As shown in FIG. 3, the vapor chambers 300 may be implemented to correspond to the respective plane shapes of the metal circuits 111 and 121 within the limit of not leaving the insulating layers 112 and 122.

In the instant case, it may be confirmed that the substrate connection areas of the vapor chambers 300 are greatly expanded compared to that shown in FIG. 2, and the heat transfer efficiency may be improved as the areas of the vapor chambers 300 increase.

Furthermore, even in the instant case, first sides of the vapor chambers 300 are prevented from overlapping with insulation lines forming circuit patterns of the metal circuits

111 and 121 so that electrical connection relationships between the substrate 100, the semiconductor chips 200, etc. may be maintained.

Meanwhile, even in such exemplary embodiments of the present disclosure, it is appropriate that each of the respective connection areas between the vapor chambers 300 and the semiconductor chips 200 is still formed to be less than or equal to the plane area of the active area of the semiconductor chip 200 as described in FIG. 1 and FIG. 2.

According to various exemplary embodiments of the present disclosure as described above, vapor chambers, each including the fluid flowing therein and the predetermined shape, further expand the range in which heat generated through the structure for connecting the substrates and semiconductor chips is transferred to the substrates, so that the thermal conductivity of the power module may be improved.

Accordingly, the cooling efficiency of the power module is improved so that the power module may stably operate at a lower temperature.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module comprising:
   at least one substrate including an insulating layer and a metal circuit disposed on a first side of the insulating layer;
   a semiconductor chip; and
   at least one vapor chamber having a fluid flowing therein and disposed between the semiconductor chip and the at least one substrate,
   wherein each of the at least one vapor chamber includes:
   a first side thereof including a plane area greater than or equal to a plane area of the semiconductor chip and connected to the metal circuit of the at least one substrate; and
   a second side thereof facing the first side along a first direction and connected to the semiconductor chip.

2. The power module of claim 1, wherein the at least one substrate includes:
   a first substrate; and
   a second substrate spaced along the first direction, wherein the respective metal circuits of the first substrate and the second substrate face each other with the semiconductor chip interposed between the respective metal circuits.

3. The power module of claim 1, wherein the at least one vapor chamber is electrically connected to the metal circuit of the at least one substrate.

4. The power module of claim 3, wherein the first side of the at least one vapor chamber is bonded to the metal circuit of the at least one substrate through soldering.

5. The power module of claim 1, wherein the first side of the at least one vapor chamber does not overlap an insulation line forming a metal circuit pattern.

6. The power module of claim 1, wherein the at least one vapor chamber includes:

a first vapor chamber including a second side connected to an active area of the semiconductor chip.

7. The power module of claim 6, wherein a plane area of the second side of the first vapor chamber is less than or equal to a plane area of the active area.

8. The power module of claim 6, wherein a portion in the second side of the first vapor chamber includes a lateral surface inclined in a predetermined slope with respect to a portion in the first side of the first vapor chamber.

9. The power module of claim 7, wherein a plane area of a portion extending by a first distance along the first direction on a first side of the first vapor chamber is greater than or equal to a plane area of a portion extending by a second distance greater than the first distance.

10. The power module of claim 6, wherein the at least one vapor chamber further includes:

a second vapor chamber including a second side thereof connected to a side of the semiconductor chip opposite to the active area of the semiconductor chip.

11. The power module of claim 10, wherein a plane area of the second side of the second vapor chamber is greater than or equal to the plane area of the semiconductor chip.

12. The power module of claim 11, wherein, in the second vapor chamber, a plane area of a first side thereof and the plane area of the second side thereof correspond to each other.

13. The power module of claim 1, wherein the semiconductor chip is in plural, each of the semiconductor chips is spaced from each other along a second direction crossing the first direction on the at least one substrate, and the at least one vapor chamber is spaced from each other along the second direction so that each vapor chamber is disposed between one of the at least one substrate and one of the semiconductor chips.

14. The power module of claim 13, wherein each of the semiconductor chips is disposed so that directions in which active areas of a predetermined number of the semiconductor chips are directed and directions in which active areas of remaining number of the semiconductor chips are directed are opposite to each other along the first direction, and in the at least one vapor chamber, a plane area of a portion in which an active area of each semiconductor chip is disposed is less than or equal to the plane area of the active area, and a plane area of a portion in which a side opposite to the active area of each semiconductor chip is disposed is greater than or equal to the plane area of each semiconductor chip.

15. The power module of claim 1, wherein each of the at least one substrate further includes:

a heat dissipation layer disposed on a first side of the insulating layer opposite to a second side of the insulating layer along the first direction, the second side facing each semiconductor chip.

16. The power module of claim 15, wherein the heat dissipation layer is connected to a cooling channel.

17. The power module of claim 1, wherein the metal circuit connected to the at least one vapor chamber is formed to have a thinner thickness than a thickness of peripheral portions of the metal circuit not connected to the at least one vapor chamber.

* * * * *